(12) United States Patent
Meyer et al.

(10) Patent No.: US 8,652,339 B1
(45) Date of Patent: Feb. 18, 2014

(54) PATTERNED LIFT-OFF OF THIN FILMS DEPOSITED AT HIGH TEMPERATURES

(71) Applicants: David J. Meyer, Fairfax, VA (US); Neil P. Green, Fairfax Station, VA (US); David A. Deen, Edina, MN (US); Steven C. Binari, Annandale, VA (US)

(72) Inventors: David J. Meyer, Fairfax, VA (US); Neil P. Green, Fairfax Station, VA (US); David A. Deen, Edina, MN (US); Steven C. Binari, Annandale, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/746,361

(22) Filed: Jan. 22, 2013

(51) Int. Cl.
*C03C 15/00* (2006.01)
(52) U.S. Cl.
USPC .................................. 216/41; 430/5; 430/314
(58) Field of Classification Search
None
See application file for complete search history.

(56) References Cited

U.S. PATENT DOCUMENTS

| | | | | |
|---|---|---|---|---|
| 4,387,145 | A * | 6/1983 | Lehrer et al. | 216/12 |
| 4,614,021 | A * | 9/1986 | Hulseweh | 216/13 |
| 4,814,258 | A | 3/1989 | Tam | |
| 5,494,179 | A * | 2/1996 | Hori et al. | 216/11 |
| 5,606,225 | A * | 2/1997 | Levine et al. | 315/169.3 |
| 5,658,469 | A * | 8/1997 | Jennison | 428/611 |
| 6,582,889 | B1 * | 6/2003 | Kamijima | 430/312 |

OTHER PUBLICATIONS

Fuller et al, Lift-Off Metal Patterning, Mar. 1, 2012, Rochester Institute of Technology, p. 1-18.*

S. Sirviö, R.L. Puurunen, and H. Kattelus. "Electrical Properties of Capacitors with ALD-Grown Al2O3 and Al2O3-TiO2 Nanolaminate Thin Film Dielectric Layers." Presented at AVS 8th International Conference on Atomic Layer Deposition. Bruges, Belgium. Jun. 29-Jul. 2, 2008.

I. M. Huygens, W.P. Gomes, and K. Strubbe. "Etching of Germanium in Hydrogen Peroxide Solutions." ECS Transactions. 6 (2) 375-386 (2007).

* cited by examiner

*Primary Examiner* — Binh X Tran
*Assistant Examiner* — David Cathey, Jr.
(74) *Attorney, Agent, or Firm* — US Naval Research Laboratory; Joslyn Barritt

(57) ABSTRACT

A method for patterned deposition of an arbitrary thin film on an arbitrary substrate. A GaAs substrate having a bi-layer structure deposited thereon, the bi-layer structure consisting of a bottom layer of Ge and a top layer of SiN. A photoresist deposited on the top SiN surface of the sample is patterned to form one or more desired patterned features on the sample. The Ge—SiN bi-layer structure on the patterned sample is aniostropically etched so that an undercut is formed in the Ge layer, the SiN forming an overhang over a portion of the GaAs substrate. The remaining photoresist is removed from the sample and the film is deposited on the sample to form a feature on the substrate. The remaining Ge layer is etched away and the SiN layer and film deposited on the SiN layer are lifted from the sample, leaving only the patterned features on the substrate.

15 Claims, 10 Drawing Sheets

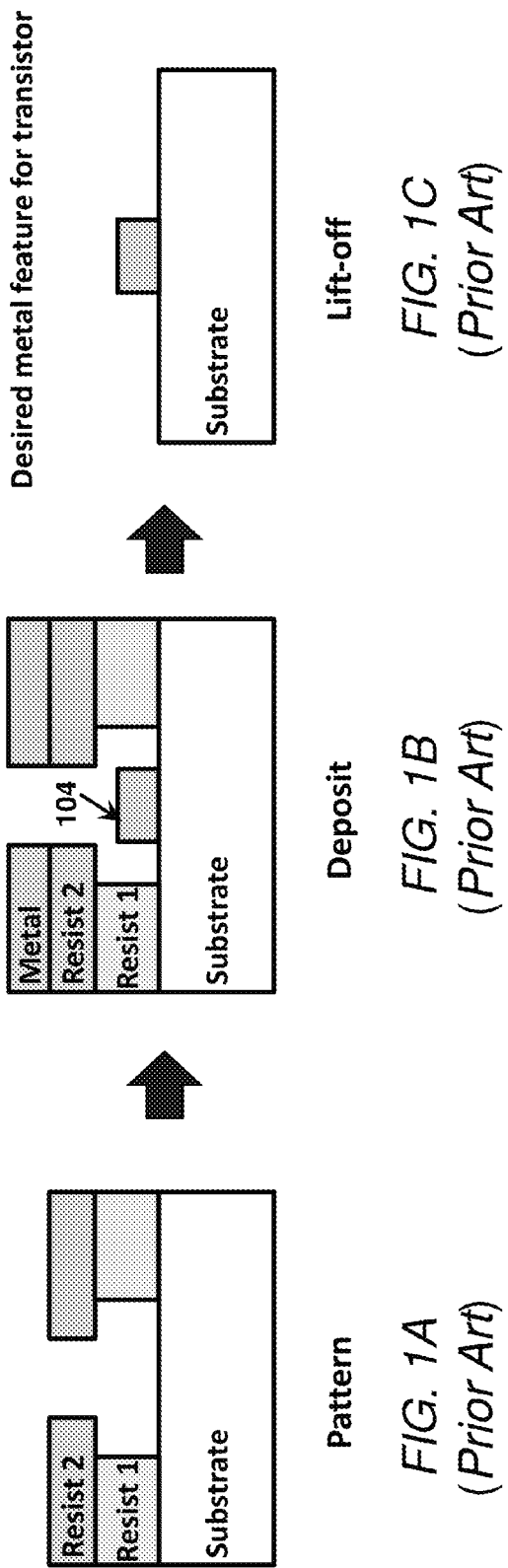

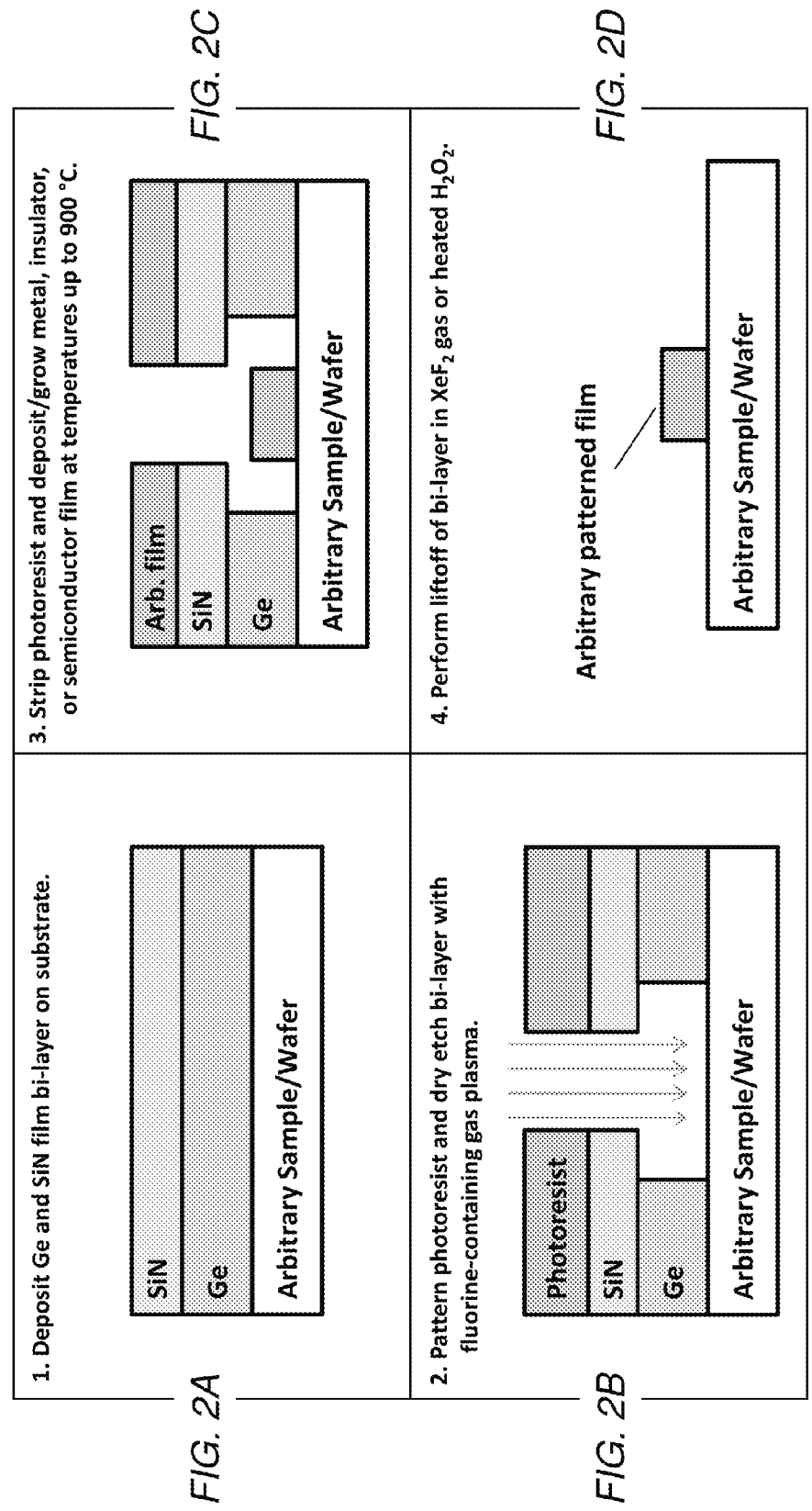

PATTERNED LIFT-OFF OF THIN FILMS DEPOSITED AT HIGH TEMPERATURES

TECHNICAL FIELD

The present invention relates microfabrication of patterned materials on a substrate, including microfabrication of patterned metals, dielectrics, and semiconductors for use in electronic applications.

BACKGROUND

Lift-off processing is a well-known, ubiquitous microfabrication technique that typically uses one or more layers of photoresist to define a pattern for selectively placing metal on a sample surface. See, e.g., U.S. Pat. No. 4,814,258 to Tam, entitled "PMGI Bi-Layer Lift-Off Process."

Aspects of conventional lift-off process are illustrated in FIGS. 1A-1C. In the first steps of such a conventional lift-off process, illustrated in FIG. 1A, one or more layers of photoresist are deposited on a substrate and are masked with a photomask, with UV light being used to expose a pattern that can be developed (removed) using standard wet-chemical developers. After the patterned features are developed, as shown in FIG. 1B, metal is deposited across the entire sample, using a technique such as evaporation or sputtering. The act of "lift-off" occurs next, when a solvent or photoresist stripper is used to remove the remaining undeveloped photoresist, which carries with it the overlying (unwanted) metal, and as shown in FIG. 1C, where photoresist had been developed away, metal remains adhered to the sample surface in the desired pattern.

While such conventional photolithography-based lift-off processing has been the work-horse of the silicon industry for decades, it has limitations that prohibit it from being used to lift-off materials other than metals. The primary disadvantage of photolithography based lift-off is that it relies upon the use of polymer-based photoresist, which has a relatively low glass transition (melting) temperature typically between 100-150° C. Since several dielectrics and semiconductors require deposition/growth temperatures greater than 300° C. to achieve high electrical quality, photoresist lift-off is not a viable method for patterning them.

Another common disadvantage of photolithography is that photoresist developers are typically strong bases. In addition to environmental concerns about disposal, developers have been shown to undesirably etch certain metals and dielectrics. For example, commonly-used tetra-methyl ammonium hydroxide (TMAH) based developers, such as CD-26, is known to etch both aluminum metal and amorphous $Al_2O_3$. See S. Sirviö, R. L. Puurunen, and H. Kattelus. "Electrical Properties of Capacitors with ALD-Grown $Al_2O_3$ and $Al_2O_3$—$TiO_2$ Nanolaminate Thin Film Dielectric Layers." Presented at *AVS* 8th *International Conference on Atomic Layer Deposition*. Bruges, Belgium. Jun. 29-Jul. 2, 2008. We have also experimentally observed amorphous $Al_2O_3$ etching in the sodium hydroxide-based developer 352.

Up until now, there has been only limited investigation into the use of non-photoresist materials for lift-off purposes. For example, Lehrer and Vincak used a bi-layer of $SiO_2/GeO_2$ patterned by photolithography and etched with a $CF_4$ plasma etch. See U.S. Pat. No. 4,387,145 to Lehrer et al., entitled "Lift-off shadow mask." Since the $GeO_2$ etch rate is 5-10 times faster than the $SiO_2$, this method creates a $SiO_2$ overhang (referred to as a re-entrant profile) that serves to create a discontinuity in metal that is blanket deposited. After metal deposition, the inventors submerse the sample in water, which dissolves the $GeO_2$ and lifts off the overlying layers. A limitation with this method is that the $GeO_2$ and $SiO_2$ are deposited in a conventional chemical vapor deposition (CVD) reactor at 400° C. with oxygen as a precursor. This could be deemed undesirable if a sample has an oxygen-reactive surface or if there are metal contacts present that would oxidize at 400° C.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an improved and more versatile method of patterning thin films of various materials on planar substrates. The method of the present invention permits a wide range of films to be deposited at a wide range of temperatures, including high temperatures above 150° C.

In an exemplary embodiment in accordance with the present invention, a sample is prepared consisting of a GaAs substrate having a bi-layer structure deposited thereon, the bi-layer structure consisting of a layer of Ge and a layer of SiN deposited on the Ge layer. A photoresist is deposited on the top SiN surface of the sample and the photoresist is patterned to form one or more desired patterned features on the sample. The Ge—SiN bi-layer structure on the patterned sample is then etched using slightly anisotropic etching so that an undercut is formed in the Ge layer, with the SiN forming an overhang over a portion of the GaAs substrate. After the etching step, the remaining photoresist is removed from the sample. Next, the arbitrary film is deposited on the sample such that it forms a layer on the top of the SiN layer and on the surface of the substrate outside of the overhanging SiN forming one or more features defined by the patterning of the photoresist. After deposition of the arbitrary film, the remaining Ge layer is etched away, and finally, the SiN layer and film deposited on the SiN layer are lifted from the sample, leaving only the patterned features on the substrate.

BRIEF DESCRIPTION OF THE DRAWINGS

FIGS. 1A-1C are block diagrams illustrating aspects of a conventional deposition process using photoresists deposited on a substrate in accordance with the prior art, with FIG. 1A illustrating aspects of a first step in a conventional deposition process, FIG. 1B illustrating aspects of a second step in a conventional deposition process, and FIG. 1C illustrating aspects of a third step in a conventional deposition process.

FIGS. 2A-2D are block diagrams illustrating, in overview fashion, aspects of the method for deposition of a patterned arbitrary film on an arbitrary substrate in accordance with the present invention, with FIG. 2A illustrating aspects of a first step of the method in accordance with the present invention, FIG. 2B illustrating aspects of a second step of the method in accordance with the present invention, FIG. 2C illustrating aspects of a third step of the method in accordance with the present invention, and FIG. 2D illustrating aspects of a fourth step of the method in accordance with the present invention.

DETAILED DESCRIPTION

Figure 3B:
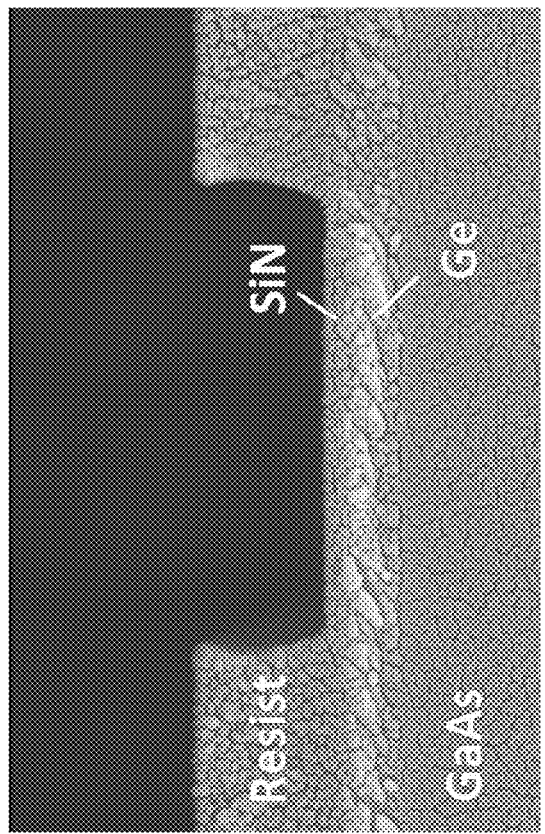
FIGS. 3A-3J illustrate in more detail the method for deposition of a patterned arbitrary film on an arbitrary substrate in accordance with the present invention, with FIGS. 3A and 3B illustrating aspects of a first step, FIGS. 3C and 3D illustrating aspects of a second step, FIGS. 3E and 3F illustrating aspects of a third step, FIGS. 3G and 3H illustrating aspects of a fourth step, and FIGS. 3I and 3J illustrating aspects of a fifth step in the method in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method for depositing an arbitrary thin film in a desired pattern on an arbitrary substrate. The method of the present invention permits a wide range of films to be deposited at a wide range of temperatures, including high temperatures above 150° C.

The patterned materials produced in accordance with the present invention include patterned metals, dielectrics, and semiconductors for use in electronic applications.

An overview of the method of the present invention is illustrated in FIGS. 2A-2D.

As shown in FIG. 2A, in the first steps of a method for depositing an arbitrary film on a substrate in accordance with the present invention, a sample is prepared by depositing a bi-layer of material on a substrate. As shown in FIG. 2B, a photoresist is then deposited on the top surface of the bi-layer and a desired pattern is formed in the photoresist. The bi-layer is then etched under slightly anisotropic conditions to form an undercut in the lower layer of the bi-layer, with the upper layer forming an overhang over the substrate. As shown in FIG. 2C, the photoresist is then removed and an arbitrary film is blanket deposited on the entire sample, including the top surface of the bi-layer and the portion of the substrate defined by the patterning step to form a patterned feature on the substrate. Finally, as shown in FIG. 2D, the bi-layer structure with the film deposited thereon is lifted away, leaving only the desired patterned feature on the substrate.

The present invention thus involves patterning and etching a thermally robust bi-layer deposited on a substrate to create openings that allow for selective placement of an arbitrary film (metal, semiconductor, or insulator) on an arbitrary substrate. In experiments to demonstrate the proof of this concept, the inventors of the present invention performed experimentation using a bi-layer of plasma-enhanced chemical vapor deposited (PECVD) SiN and e-beam evaporated Ge on a GaAs substrate, though as noted above, any suitable bi-layer structure and any suitable substrate can be used, so long as the two materials in the bi-layer do not intermix to a substantial degree at the deposition temperature, the top layer does not intermix with the photoresist, and the bottom layer etches faster than the top layer so that an overhang is formed during the etching step.

These and other aspects of the present invention are now described in more detail with respect to FIGS. 3A-3J. In these FIGURES, FIGS. 3A, 3C, 3E, 3G, and 3I are block diagrams illustrating aspects of the steps for depositing an arbitrary film on an arbitrary substrate in accordance with the present invention. To observe the experimental cross-section of the patterned features, samples were cleaved and examined using scanning-electron microscopy (SEM), where to prevent charging from the electron beam, samples were sputter coated with 6 nm of gold before being loaded into the SEM. The images so produced are shown in FIGS. 3B, 3D, 3F, 3H, and 3J.

It should be noted here that although the method of the present invention is illustrated in the context of Ge and SiN layers deposited on a GaAs substrate, with a metal film being deposited thereon, any suitable substrate, any suitable bi-layer structure, and any suitable film can be used, so long as the bi-layer materials do not intermix to a substantial degree at the deposition temperature, the top layer of the bi-layer structure does not intermix with the photoresist, and the bottom layer of the bi-layer structure etches faster than the top layer so that an overhang is formed during the etching step. Suitable materials for the substrate include, but are not limited to, GaAs, GaN, AlN, quartz, while suitable bi-layer materials include Ge/SiN, Ge/$SiO_2$, W/SiN, W/$SiO_2$, Mo/SiN, and Mo/$SiO_2$. In addition, although the Figures show a metal film deposited on the substrate, the process in accordance with the present invention is not limited deposition of metal films but can be used for the deposition of any arbitrary film such as an insulator or semiconductor.

Figure 3A:
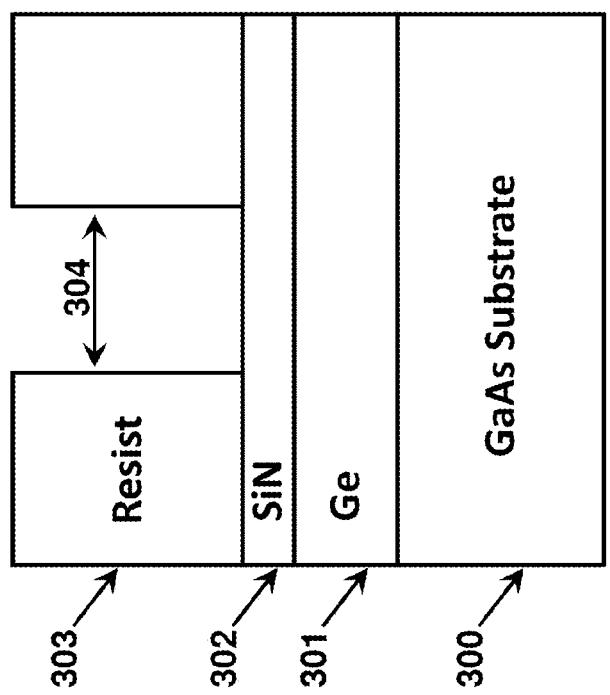

FIGS. 3A and 3B illustrate aspects of the first steps in a process for depositing an arbitrary film on an arbitrary substrate in accordance with the present invention.

In these first steps, a sample is prepared by depositing a Ge/SiN bi-layer on a GaAs substrate. Thus, as shown in FIG. 3A, in the first steps of a process in accordance with the present invention, a uniform layer 301 is deposited a GaAs substrate 300. Deposition of the Ge layer 301 can be done by any suitable technique such as sputtering or evaporation. The thickness of Ge layer 301 should be at least 1.6 times the thickness of the desired arbitrary film 306 (see FIG. 3G) intended to be lifted off. After deposition of the Ge layer 301, a uniform layer 302 of SiN is deposited to serve as the top layer in the bi-layer lift-off stack consisting of Ge and SiN layers 301 and 302. The thickness of the SiN layer 302 should be greater than 50 nm to ensure mechanical rigidity of the bi-layer overhang 305 that is created in later steps. After deposition of the SiN layer 302, a photoresist layer 303 is coated on the sample and a patterned region 304 is formed in the photoresist using any desired lithography technique such as contact or e-beam lithography. A cross-section illustrating the results of this processing is shown in the SEM image shown in FIG. 3B. In the experimental case illustrated in FIG. 3B, the sample substrate 300 was GaAs(100), and the thickness of the Ge layer 301 and the SiN layer 302 used were 200 nm and 50 nm, respectively. Shipley 1805 photoresist was used for the photoresist layer 303, and this layer was patterned using standard contact lithography.

Figure 3D:
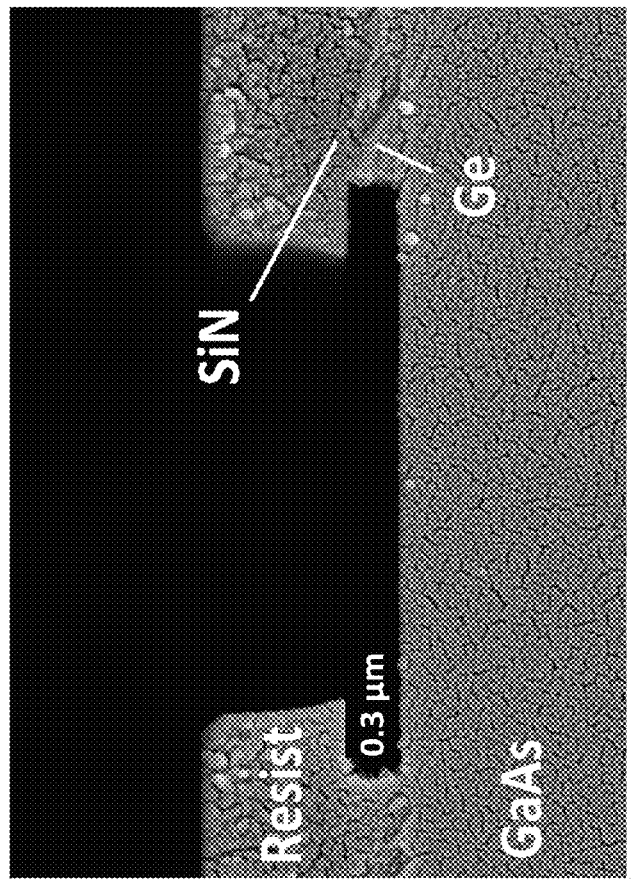
Figure 3C:
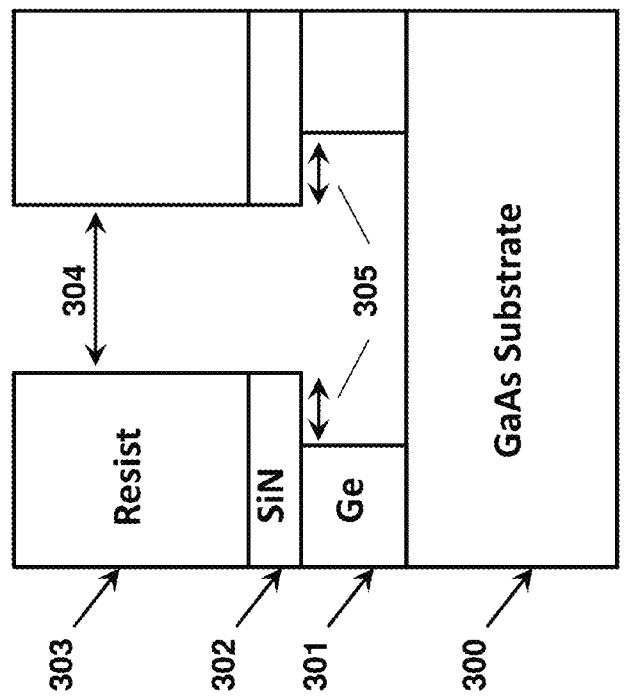

The next step in the method of the present invention, illustrated in FIGS. 3C and 3D, is to process the patterned sample to etch the exposed Ge/SiN bi-layer 301/302 contained laterally below patterned region 304. In the exemplary embodiment illustrated in FIGS. 3C and 3D, etching was performed using a fluorine-containing plasma, but one skilled in the art will appreciate that any appropriate etching technique may be used. The etching is done in a slightly anisotropic manner, and as noted above, the lower Ge layer 301 etches slightly faster under such anisotropic etching than does the upper SiN layer 302. As illustrated in FIG. 3C, as a result, SiN layer 302 remains unetched directly under photoresist 303, while Ge layer 301 is undercut, leaving SiN overhangs 305 over the Ge layer the substrate. The SEM image in FIG. 3D shows the experimental results obtained by the inventors after using an $SF_6$ inductively-coupled plasma (ICP) with ICP RF power of 200 W and bottom electrode power of 50 W to perform a 20 second anisotropic dry etch of the Ge/SiN bi-layer in a chamber under 5 mTorr pressure. As shown in FIG. 3D, this etching step produced SiN overhangs having a length of approximately 0.3 μm.

After the dry etch forming the undercut is performed, in the next step, the remaining photoresist 303 is removed from the sample using a solvent such as acetone or another photoresist stripper. A cross-section of the sample after this step is shown in FIG. 3E, with a corresponding SEM image shown in FIG. 3F. Physical agitation, such as ultrasonics, of the sample should be avoided in order to maintain the integrity of the SiN overhangs 305. In the experimentation performed by the inventors, an acetone bath was used to remove the photoresist, followed by brief iso-propyl alcohol and deionized water baths to remove any residue from the acetone, and the resulting cross-section is shown in FIG. 3E. As can be seen from FIG. 3F, the length of the SiN overhang remains unchanged after the photoresist is removed, and remains at approximately 0.3 μm.

Once the photoresist is removed from the sample, the next step is to blanket deposit one or more desired arbitrary films on the sample. This can be accomplished with any suitable technique, including, but not limited to, e-beam evaporation, physical vapor deposition, molecular beam epitaxy, chemical vapor deposition, sputtering, atomic layer deposition and PECVD, so long as the deposition technique does not result in a completely conformal coating of the SiN/Ge bi-layer feature. Thus, in the exemplary general case illustrated in FIGS. 3G, metal is deposited on the sample to form both metal layer 306 on the upper surface of SiN layer 302 and metal feature 307 on the surface of the substrate 300 in the patterned area of the substrate defined in the photolithography step. In the experimental case illustrated in FIG. 3H, the inventors used a contact lithography mask with feature sizes as small as 1 micron and e-beam evaporation to deposit Ti/Au layers having a thickness of 20 and 80 nm, respectively; FIG. 3H shows a plan-view optical micrograph of the resulting patterned Ti/Au deposition.

Figure 3F:
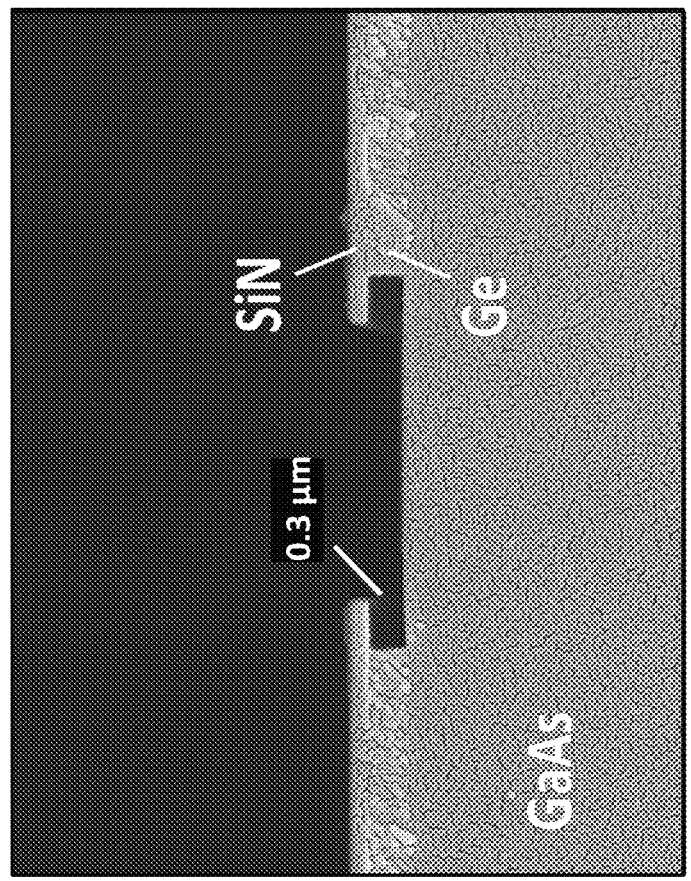
Figure 3E:
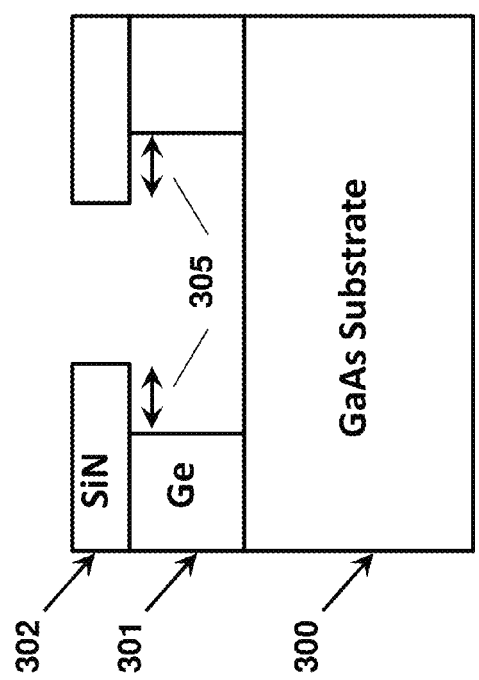
Figure 3H:
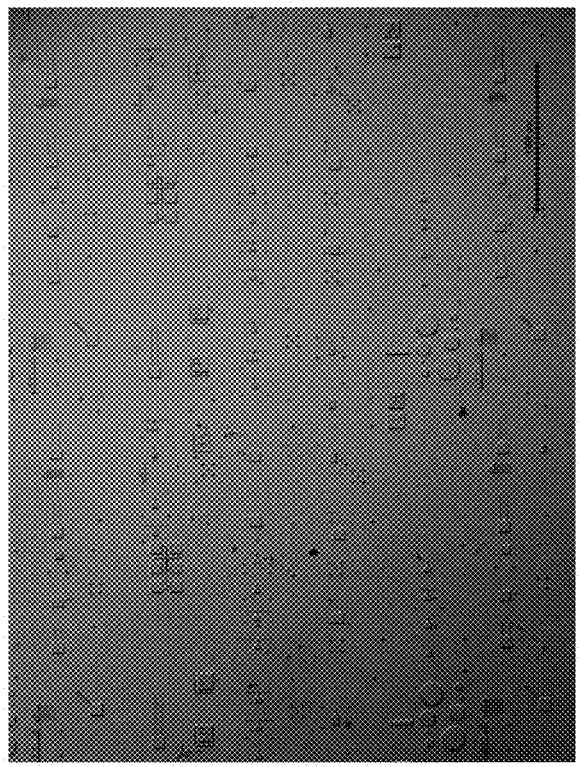
Figure 3G:
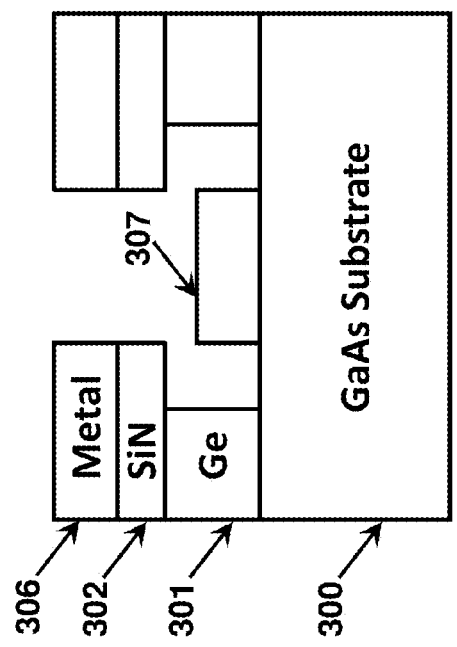
Figure 3J:
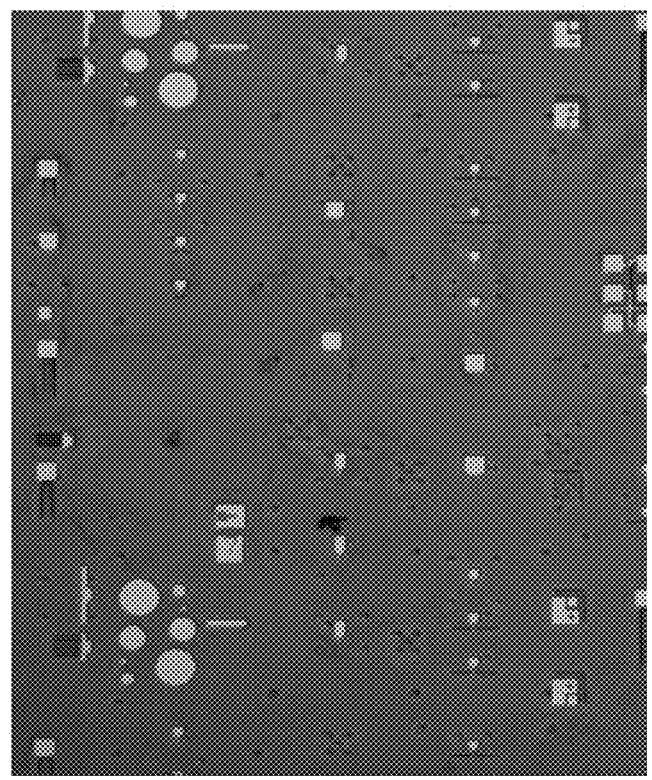
Figure 3I:
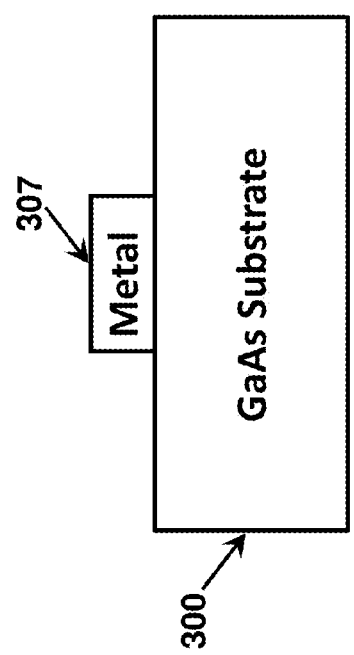

Finally, in the last step of a method for patterned deposition of a thin film on a substrate in accordance with the present invention, aspects of which are illustrated in FIGS. 3I and 3J, the film is lifted off in the non-patterned areas of the substrate, so that only the desired, patterned features 307 remain. In an exemplary embodiment, lift-off can be achieved using a heated, e.g., at about 100° C., bath of hydrogen peroxide ($H_2O_2$), though other solutions and/or other temperatures, such as pH-altered $H_2O_2$ or $XeF_2$ gas, can also be used as appropriate. The $H_2O_2$ reacts vigorously with Ge causing bubbling and etching of the Ge layer 301. Once the entire Ge layer 301 is etched away, SiN layer 302 and film layer 306 can be lifted away from sample, leaving only the patterned feature 307 on the substrate 300, as shown in FIG. 3I. FIG. 3J illustrates the patterned features remaining on the substrate after this lift-off step in the exemplary case obtained by the inventors herein.

Advantages and New Features:

As noted above, although an exemplary embodiment employing a SiN/Ge bi-layer on a GaAs substrate is described, the method of the present invention can be used with any suitable bi-layer and any suitable substrate to permit the deposition of a wide range of films. A significant advantage of the present invention is that it enables the selective placement of one or more sequentially deposited films on sample substrates with wide temperature range tolerance. So long as no eutectics are formed between the lower layer in the bi-layer and the substrate, the melting point of the lower layer material provides an upper temperature limit for the film deposition. For example, the melting point of 938° C. for Ge establishes the upper temperature limit of the arbitrary film deposition technique that can be used with this method. Comparing this to the upper temperature limit of 100-150° C. for a photoresist-based lift-off procedure, the proposed method opens up a number of possibilities. For example, in addition to metal films as in the exemplary embodiment described herein, films that can be deposited include high quality insulators or semiconductors, and substrates can include, but are not limited to, GaAs, GaN, and quartz.

Figure 4:
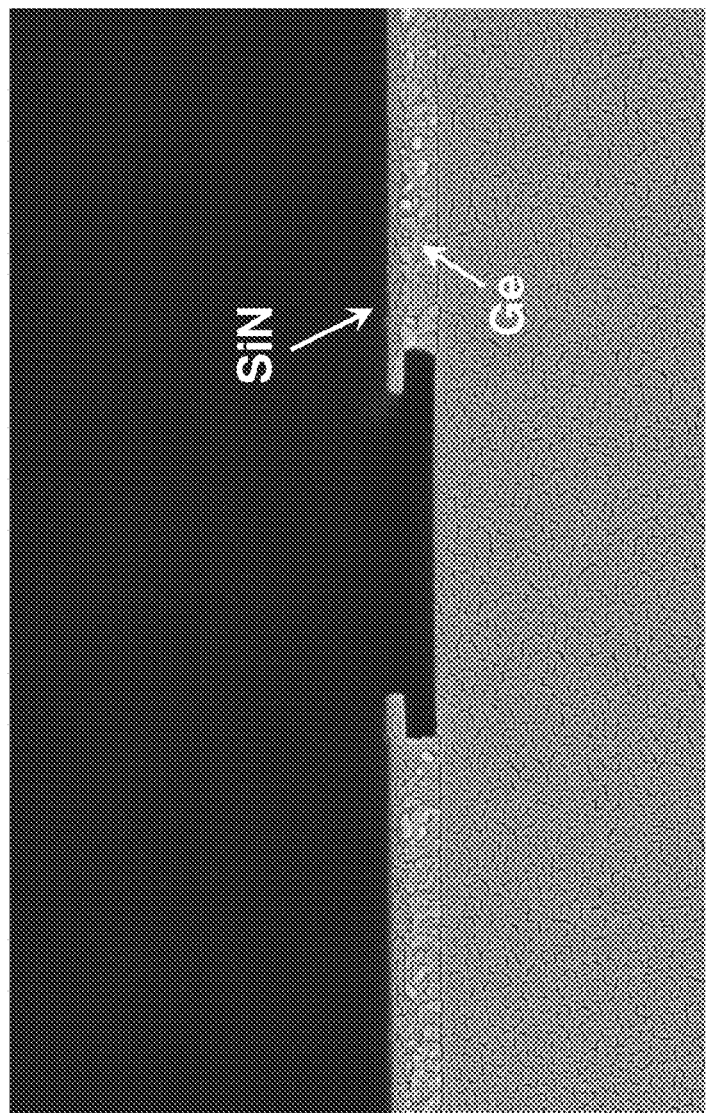
FIG. 4 is an SEM image of a cross-section of a patterned SiN/Ge feature in accordance with the present invention after 5 minutes of annealing at 600° C.

To demonstrate the high-temperature tolerance of the patterned SiN/Ge bi-layer, the inventors of the present invention annealed a sample similar to the one in FIG. 3F at 600° C. for 5 minutes and then examined the results. The cross-sectional SEM image of the SiN/Ge bi-layer on a GaAs substrate shown in FIG. 4 illustrates that there is effectively no change in the bi-layer as a result of the high-temperature exposure.

Figure 5A:
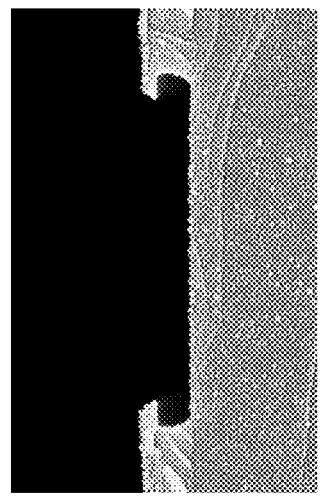
FIGS. 5A-5C are SEM images of a cross-section of a patterned SiN/Ge feature in accordance with the present invention after 15, 30, and 45 seconds, respectively, of $SF_6$ plasma etching.
Figure 5B:
Figure 5C:
Figure 6:
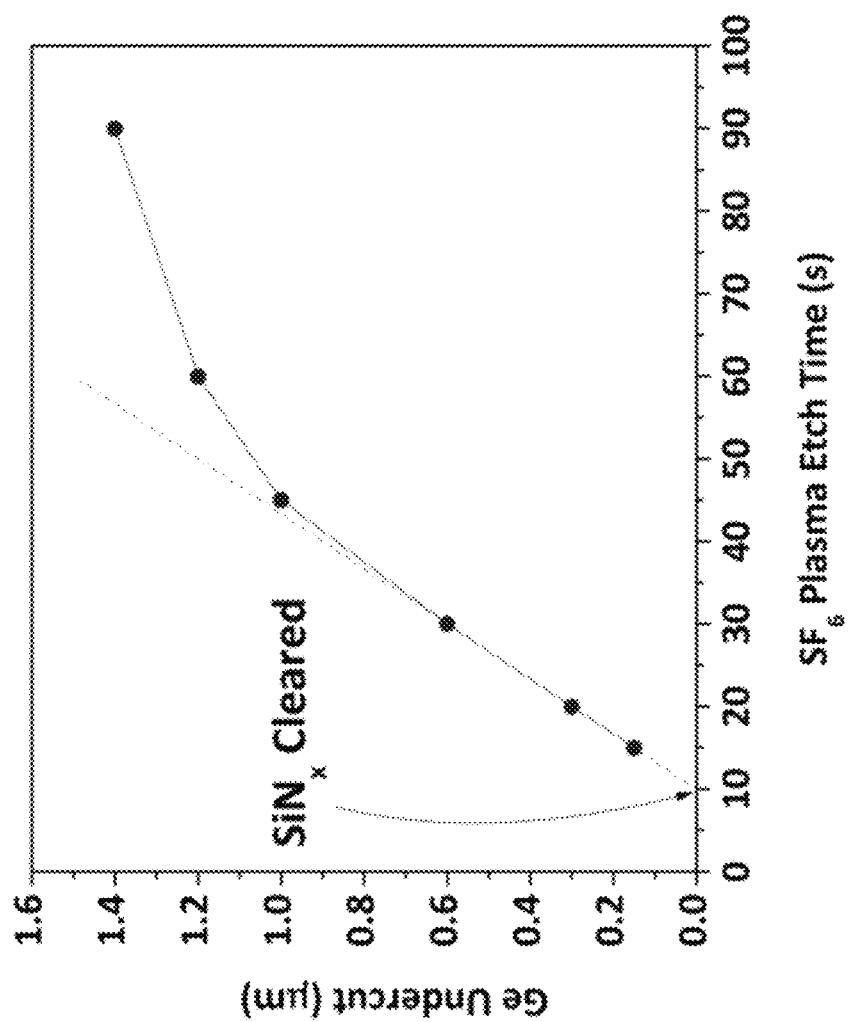
FIG. 6 is a plot illustrating the amount of Ge undercut as a function of $SF_6$ etch time.

A second advantage of this technique is that the undercut rate of the Ge layer is controllable and self-limiting. FIGS. 5A-5C show a substrate with a patterned SiN/Ge bi-layer after 15, 30, and 45 seconds of an $SF_6$ plasma etch, respectively. The plot in FIG. 6, which plots Ge layer undercut length as a function of $SF_6$ plasma etch time, further illustrates this characteristic of a Ge layer used in accordance with the present invention. As can be seen from the plot in FIG. 6, up until approximately 0.6 or 0.7 microns of Ge undercut length, the lateral etch rate of Ge is linear with $SF_6$ plasma exposure time. After that point, the rate slows and appears to saturate at a maximum Ge undercut length of approximately 1.5 microns.

A third advantage of a method for patterned deposition this method is that basic photoresist developers are not brought into contact with the sample surface. Instead, the surface is only exposed to $SF_6$ plasma and pH-neutral $H_2O_2$. This can be advantageous when dealing with chemically sensitive samples such as N-polar GaN and III—Sb materials, which are susceptible to etching in photoresist developers. Another benefit of using $H_2O_2$ compared to standard developers is that it is a safer chemical to work with and is more environmentally friendly in terms of disposal.

A fourth advantage of this invention method is that the SiN/Ge feature size is the same as the overlying photoresist feature size, i.e. there is no critical dimension blowout from the intended size due to lateral SiN etching. This implies that any lithography method could be used to generate the pattern and there is no fundamental limitation to using this technique with sub-micron feature sizes.

Alternatives:

Although particular embodiments, aspects, and features have been described and illustrated, it should be noted that the invention described herein is not limited to only those embodiments, aspects, and features, and it should be readily appreciated that modifications may be made by persons skilled in the art.

For example, there are a number of variations on the SiN/Ge structure that could be used for metal cross-section shaping. For instance, a SiN/Ge/SiN tri-layer stack could be used to fabricate an insulated T-shaped gate for a transistor, where the gate insulator and metal would be deposited sequentially and then lifted-off outside of the gate region. If a sample was sensitive to Ge, a thin film could be placed in between the Ge and substrate to act as a diffusion barrier during the arbitrary film deposition/growth.

In our proof of concept and detailed description, we have focused on SiN as the top layer in the lift-off stack. We also suspect that other films could be used for this layer, such as $SiO_2$ or other metals. By changing the top layer composition, selectivity could be gained between etching the top and bottom layers in the lift-off stack.

As we found in our experimentation, the lift-off in heated $H_2O_2$ took over 2 hours to complete. In order to speed up the lift-off/Ge etching process, an alternative to using pure $H_2O_2$ could be to change the pH of the solution by adding a small amount of another acid or base. For example, Huygens et al. found that the etch rate of Ge could be increased by up to a factor of ten by adding either KCl or KOH. I. M. Huygens, W. P. Gomes, and K. Strubbe. "Etching of Germanium in Hydrogen Peroxide Solutions." *ECS Transactions*. 6 (2) 375-386 (2007).

It is possible that the alteration of the solution pH could also be beneficial in terms of preventing undesirable electrochemical etching of sensitive samples.

The present application contemplates any and all modifications within the spirit and scope of the underlying invention described and claimed herein, and all such embodiments are within the scope and spirit of the present disclosure.

What is claimed is:

1. A method for fabricating a patterned thin film on a substrate, comprising:
    preparing a sample by depositing a multi-layer structure of material on the substrate, the multi-layer structure including a bottom layer disposed adjacent the substrate and a top layer disposed on an upper surface of the bottom layer, a thickness of the bottom layer being substantially greater than a thickness of the thin film to be deposited on the sample, the multi-layer materials being configured to not substantially intermix with each other or with the substrate at a thin film deposition temperature;
    depositing a photoresist on an upper surface of the top layer of the multi-layer structure;
    patterning the photoresist to expose the multi-layer material in a desired pattern;
    anisotropically etching the exposed multi-layer material to expose the substrate in the desired pattern, the bottom layer of the multi-layer being removed during the etching at a higher rate than other layers in the multi-layer structure so as to form an undercut in the bottom layer, the other layers forming an overhang over a portion of the substrate defined by the undercut, a total thickness of the other layers being sufficient to ensure rigidity of the overhang;
    removing the photoresist;
    blanket depositing a thin film on the sample, the thin film forming a feature on the substrate only on the portion of the substrate defined by the desired pattern; and
    removing the multi-layer structure from the substrate, leaving only the thin film feature on the substrate.

2. The method according to claim 1, wherein the multi-layer structure comprises an SiN/Ge bi-layer consisting of a bottom Ge layer and a top SiN layer.

3. The method according to claim 2, wherein the Ge layer has a thickness of at least 1.6 a thickness of the thin film to be deposited.

4. The method according to claim 2, wherein the SiN layer has a thickness of about 50 nm.

5. The method according to claim 1, wherein the multi-layer structure is an SiN/Ge/SiN structure.

6. The method according to claim 1, wherein the multi-layer structure is a bilayer comprising one of a $Ge/SiO_2$, W/SiN, $W/SiO_2$, Mo/SiN, and a $Mo/SiO_2$ bilayer.

7. The method according to claim 1, wherein the substrate comprises one of GaAs, GaN, AlN, and quartz.

8. The method according to claim 1, wherein the thin film is a metal film.

9. The method according to claim 1, wherein the thin film is an insulating film.

10. The method according to claim 1, wherein the thin film is a semiconducting film.

11. The method according to claim 1, wherein the thin film is deposited at a temperature of 25° C. to 900° C.

12. The method according to claim 1, wherein the multi-layer structure is etched using a $SF_6$ plasma dry etch to form the undercut in the bottom layer.

13. The method according to claim 1, further comprising placing the sample in a warm $H_2O_2$ bath after deposition of the thin film to remove the bottom layer of the multi-layer structure.

14. The method according to claim 1, further comprising placing the sample in a pH-altered $H_2O_2$ bath after deposition of the thin film to remove the bottom layer of the multi-layer structure.

15. The method according to claim 1, further comprising placing the sample in a $XeFe_2$ atmosphere after deposition of the thin film to remove the bottom layer of the multi-layer structure.

* * * * *